US006531698B1

(12) United States Patent
Benner

(10) Patent No.: US 6,531,698 B1
(45) Date of Patent: Mar. 11, 2003

(54) PARTICLE-OPTIC ILLUMINATING AND IMAGING SYSTEM WITH A CONDENSER-OBJECTIVE SINGLE FIELD LENS

(75) Inventor: Gerd Benner, Aalen (DE)

(73) Assignee: Leo Elektronenmikroskopie GmbH, Oberkochen (DE)

( * ) Notice: Subject to any disclaimer, the term of this patent is extended or adjusted under 35 U.S.C. 154(b) by 12 days.

(21) Appl. No.: 09/668,497

(22) Filed: Sep. 22, 2000

(30) Foreign Application Priority Data

Sep. 22, 1999 (DE) .......................... 199 45 344

(51) Int. Cl.$^7$ .................... H01J 37/26; H01J 29/46
(52) U.S. Cl. .............. 250/311; 250/307; 250/396 ML; 250/396 R
(58) Field of Search ................. 250/311, 307, 250/396 ML, 396 R

(56) References Cited

U.S. PATENT DOCUMENTS

| | | | |
|---|---|---|---|
| 3,560,781 A | | 2/1971 | Riecke |
| 4,306,149 A | | 12/1981 | Le Poole et al. |
| 4,633,085 A | | 12/1986 | Tomita et al. |
| 5,013,913 A | * | 5/1991 | Benner .................. 250/307 |
| 5,373,158 A | | 12/1994 | Murakoshi et al. |
| 5,483,073 A | * | 1/1996 | Benner .................. 250/311 |
| 5,519,216 A | * | 5/1996 | Benner et al. .......... 250/311 |

FOREIGN PATENT DOCUMENTS

| | | | |
|---|---|---|---|
| DE | 28 22 242 C2 | 5/1990 | ............ H01J/37/26 |
| EP | 0 352 552 A2 | 7/1989 | ............ H01J/37/26 |

OTHER PUBLICATIONS

Patentschrift Nr.875 555; Gruppe, Class 21g; 5 pages.
European Search Report, EP 00 11 8942, 2 pages, Feb. 27, 2001.

* cited by examiner

Primary Examiner—Bruce Anderson
Assistant Examiner—Nikita Wells

(57) ABSTRACT

The invention relates to a particle-optic illuminating and imaging system with a condenser-objective single field lens (5) and a simple illuminating system which has only two condenser lenses (3, 4). The variation of the size of the illuminated field takes place exclusively by a change of the excitation of the source-side condenser lens (3). The objective-side second condenser lens (4) always has a constant excitation in the TEM mode. The excitation of the source-side condenser lens (3) is the greatest for maximum illuminating field diameter, and on the contrary is reduced for smaller illuminating field diameters. In TEM operation, two crossovers always exist in the illuminating beam path, of which the second is situated between the focal plane of the condenser-objective single field lens and the specimen plane (6).

20 Claims, 3 Drawing Sheets

Figure 1:
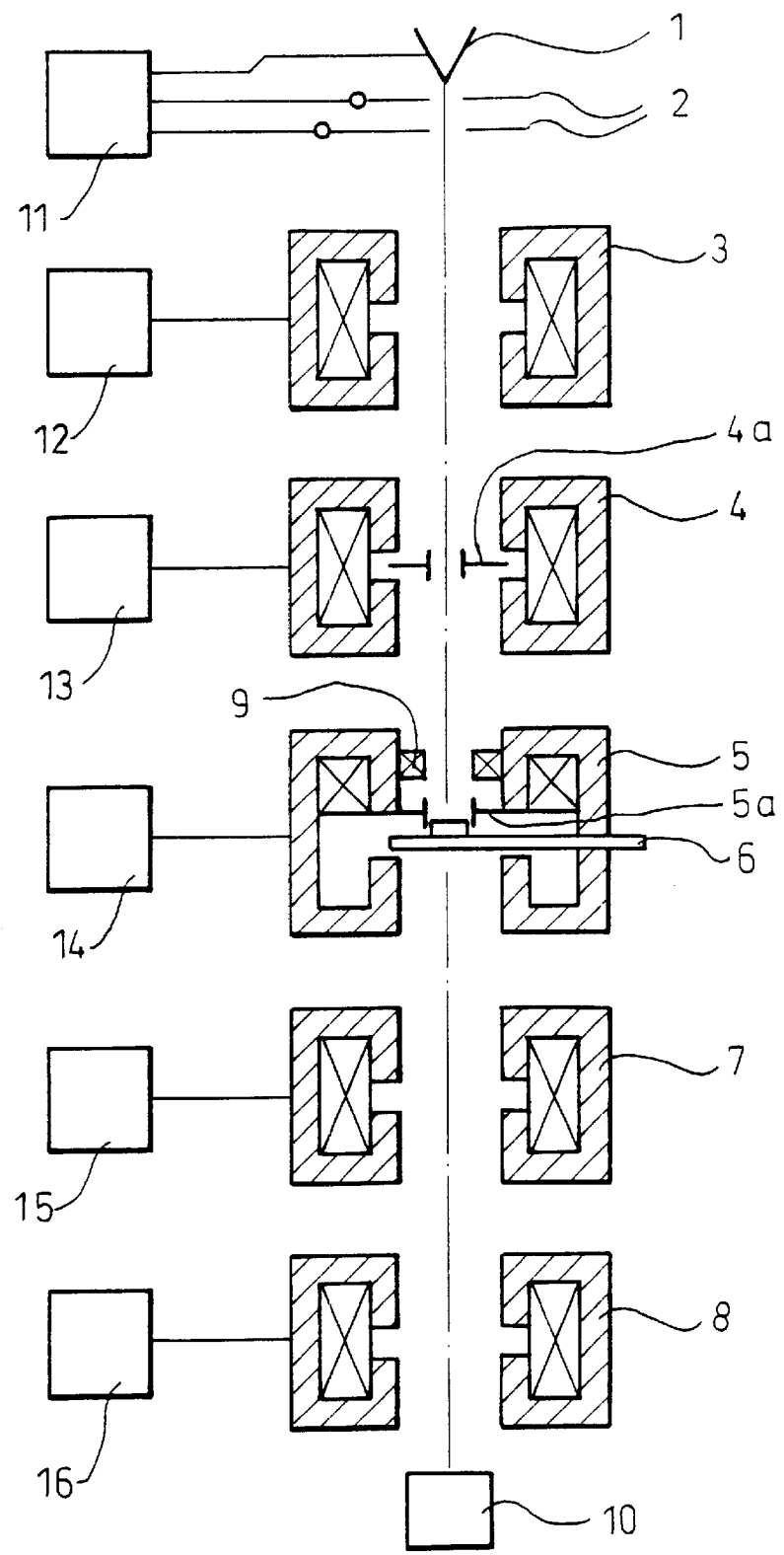

PARTICLE-OPTIC ILLUMINATING AND IMAGING SYSTEM WITH A CONDENSER-OBJECTIVE SINGLE FIELD LENS

The invention relates to a particle-optic illuminating and imaging system, particularly for a transmission electron microscope, with a condenser-objective single field lens.

Modern electron microscopes are mostly equipped with a so-called condenser-objective single field lens (hereinbelow also "KOE lens") according to Riecke and Ruska, as known, for example, from [German Patentschrift] DE-PS 875555. Condenser-objective single field lenses differ from conventional objectives in that the specimen is arranged in the middle of the pole shoe gap. By the arrangement of the specimen in the magnetic field maximum, reduced image error coefficients result in contrast to conventional objectives. Furthermore, the realization of eucentric goniometers and bar locks is substantially simplified, and in contrast to conventional objectives a greater constructional space is available for specimen tilting and for the arrangement of detectors, for example for the detection of X-rays emitted from the specimen or for the detection of back-scattered electrons. Furthermore, condenser-objective single field lenses offer the possibility of realizing very small electron probes for point analysis and for scanning operation (so-called STEM operation) with the condenser-objective single field lens.

In connection with the illuminating devices for condenser-objective single field lenses, it has heretofore been taken as a starting point that in TEM operation an imaging of the crossover of the particle source in the rear focal plane of the condenser-objective single field lens is imperatively required in order to prevent a troublesome oblique specimen illumination in off-axis regions. A corresponding illumination system which manages with only two condenser lenses is known from U.S. Pat. No. 3,560,781. In the said system, in order to make possible the different illumination apertures which are required at different magnifications, the pole shoes of the condenser lens immediately following the particle source are interchangeable, in order to attain different imaging scales for the imaging of the crossover of the particle source by means of the first condenser lens. The second condenser lens is always operated with the same fixed excitation, so that the crossover image produced by the first condenser lens is always imaged in the illumination-side focal plane of the condenser-objective single field lens. The interchanging of the pole shoes proposed here is however impractical for a serial equipment in practice, because of the required precision.

Variation of the excitation of both condenser lenses for setting different illumination apertures has already been proposed in U.S. Pat. No. 3,560,781, as an alternative to interchanging the pole shoes. However, the size of the field illuminated on the specimen is exclusively determined by the size of the condenser diaphragm in such an operation of the illuminating system. A change of the field size is therefore only possible by means of a mechanical change of the condenser diaphragm.

A so-called twin-objective lens is known from DE-C 28 22 242, in which a further lens gap is provided in the ferromagnetic circuit. The condenser diaphragm is imaged in the condenser-side focal plane of the condenser-objective single field lens with the aid of this constantly excited auxiliary lens. In this system, the illumination aperture can be varied by variation of the excitation of the second condenser lens. It is however disadvantageous that in STEM operation the field of the auxiliary lens has to be compensated by an additional coil.

A further illumination system is known from U.S. Pat. No. 4,633,085; its function largely corresponds to the function of the illumination system of DE-C 28 22 242. In U.S. Pat. No. 4,633,085, the auxiliary lens is realized solely by means of a snorkel lens arranged immediately before the objective.

Although the illumination systems of DE-A 28 22 242 and U.S. Pat. No. 4,633,085 respectively have three condenser lenses, these systems do not permit independent setting both of the illuminated field and also of the illumination aperture.

An illumination system is known from U.S. Pat. No. 5,013,913, in which the illumination aperture and the illuminated field can be set independently of each other. This system contains three condenser lenses, which image the crossover of the particle source with variable magnification, always in the source-side focal plane of the condenser-objective single field lens. The size of the crossover image then defines the illumination aperture. The size of the illuminating field is determined by the size of the condenser diaphragm, which can be varied by electron-optical selection of a suitable diaphragm from a multi-hole diaphragm. This illumination system always makes possible an optimum illumination of the specimen; this advantage is however gained at the expense of a relatively complex construction.

The present invention has as its object to provide a simple illuminating system for a condenser-objective single field lens, which makes possible a continuous variation of the illuminating field size and in which an increase of the illumination aperture accompanies a decrease of the illumination field.

This object is attained according to the invention by the particle-optic illuminating and imaging system with the features of claim 1. Advantageous developments will become apparent from the features of the dependent claims.

The particle-optic illuminating and imaging system according to the invention has a condenser-objective single field lens, two condenser lenses arranged between a particle source and the condenser-objective-single field lens, and a multi-lens imaging system arranged after the condenser-objective single field lens. In TEM operation, exclusively the excitation of the condenser lens adjacent to the particle source is varied. The excitation of the condenser lens adjacent to the condenser-objective single field lens is independent of the set size of the illuminating field in TEM operation.

TEM operation is here understood to be such operating conditions that either the diameter of the illuminated field in the specimen plane is $\geq 0.5$ $\mu$m, or the illumination aperture is $\leq 5$ mrad.

It was recognized according to the invention that the required apertures and sizes of the illuminated field in TEM operation can be realized with an illuminating system having only two condenser lenses, even with a condenser objective single field lens, solely by variation of the excitation of the source-side condenser lens. The illuminating and imaging system according to the invention therefore preferably has exactly two condenser lenses.

In setting a maximum illuminating field diameter, the source-side condenser lens has to be relatively strongly excited, so that it images the crossover of the particle source with a reduction of about 20 to 50 times. The excitation of the condenser lens on the objective side is then to be set so that this second condenser lens images the crossover produced by the first on a scale of about 1:1 in the condenser-side focal plane of the condenser-objective single field lens.

At the maximum illuminating field diameter, there thereby results an axially-parallel, coherent illumination of the regions remote from the axis, so that oblique illumination of the regions remote from the axis does not arise in this setting.

For setting smaller illuminating field diameters, the excitation of the condenser lens on the particle source side is suitably reduced, so that the image of the crossover produced by the source-side condenser lens shifts along the optical axis toward the objective-side condenser lens. The smallest illuminating field is then attained when both condenser lenses in common image the crossover of the particle source in the plane conjugate to the specimen plane with respect to the condenser-objective single field lens. The condenser-objective single field lens then images this intermediate crossover onto the specimen. At smaller illuminating field diameters, there admittedly results an oblique illumination of the off-axis regions of the specimen. Since, however, the oblique illumination increases with decreasing illumination field diameter, this does not have very troublesome effects.

So that the range of field diameters usually required in TEM operation can be realized with the two-stage condenser, the fixed imaging scale of the objective-side condenser lens had to be greater than 1:3, preferably between 1:1 and 1:3 (the maximum reduction of the crossover image about ⅓ by the second condenser lens at maximum illuminating field diameter).

In order to limit the illumination aperture at small illuminating field diameters, a front field diaphragm is to be provided in the source-side focal plane of the condenser-objective single field lens. This front field diaphragm has to be interchangeable so that large illumination apertures are attainable with a spot illumination.

With the beam paths described above, the smallest attainable illumination field diameters are in the region of 1 $\mu$m. For setting smaller illuminating field diameters, both condenser lenses (in the so-called spot or STEM mode) are operated as a zoom lens, with both condenser lenses always imaging the crossover of the particle source into the condenser-side input image plane of the condenser-objective single field lens. The condenser-objective single field lens then images the intermediate image of the crossover of the particle source, once again reduced, onto the specimen. The spot size can then be varied by different excitation of the two condenser lenses.

In the illuminating and imaging system according to the invention, a single excitation value can consequently be set for the objective-side condenser lens in TEM operation.

Figure 2:
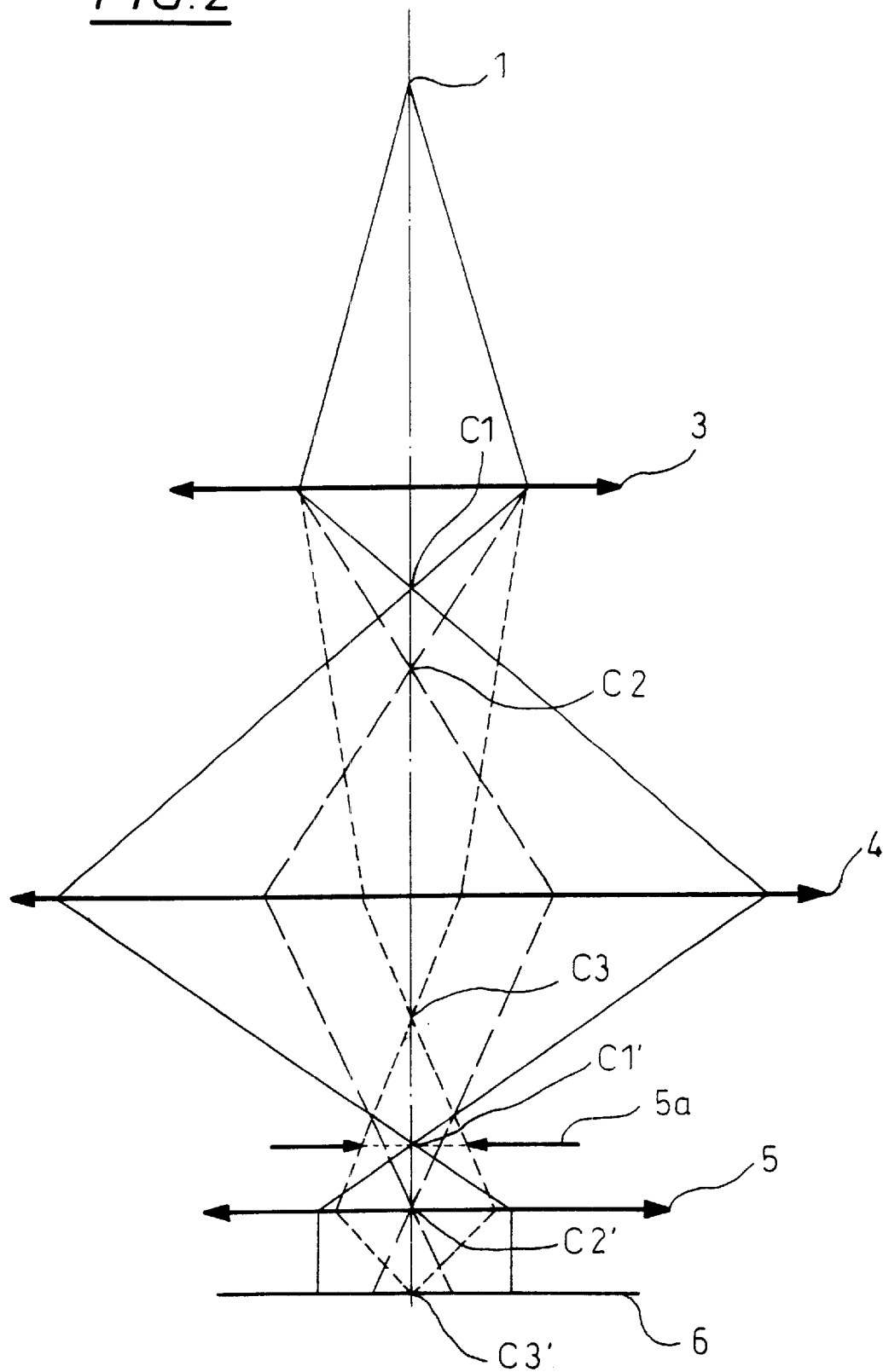
Figure 3:
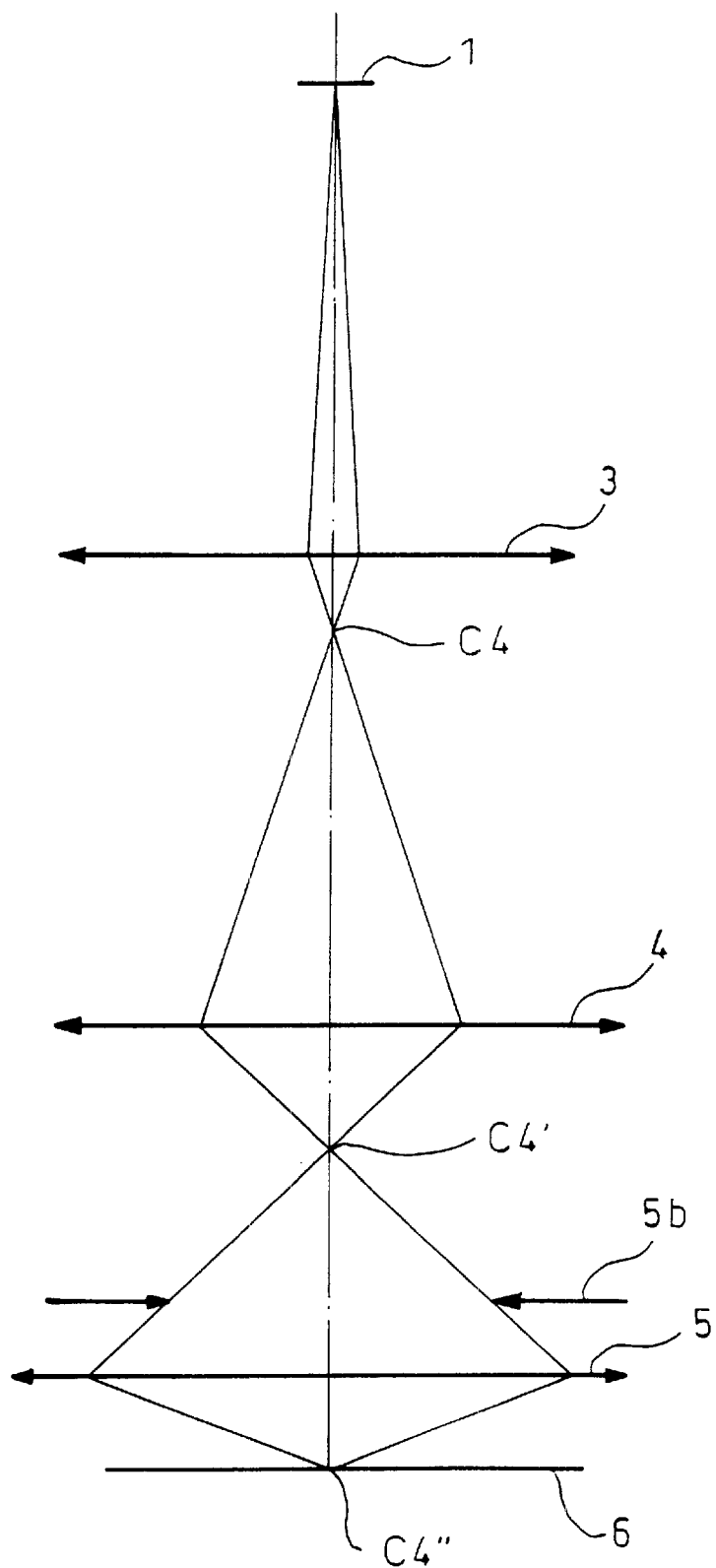

Details of the invention are described hereinbelow with reference to the embodiment example shown in the Figures. In detail, FIG. 1 shows a section along the optical axis through an electron microscope according to the invention;

FIG. 2 shows the beam paths in the illumination beam path of the electron microscope of FIG. 1, in TEM operation; and FIG. 3 shows the beam paths in the illumination beam path of the electron microscope of FIG. 1, in STEM operation.

The electron microscope in FIG. 1 has a particle source (1) with a following acceleration stage (2) for the electrons emerging from the source (1). A condenser system consisting of two magnetic lenses (3, 4) is provided for the beam shaping, on the illumination side, of the electron beam emerging from the source (1). The condenser-objective single field lens (5) follows the two condenser lenses (3, 4).

The specimen holder (6) is arranged in the condenser-objective single field lens (5) at the level of the pole shoe gap and thus in the maximum of the magnetic field of the condenser-objective single field lens. Further coils (9) are provided somewhat to the source side of the pole shoe gap of the condenser-objective single field lens, and serve as the deflecting system in STEM operation. A front field diaphragm (5a), designed to be mechanically interchangeable, is arranged in the condenser-side focal plane of the condenser-objective single field lens (5). Because of the short focal length of the condenser-objective single field lens (5), of only 3–4 mm, the position of the front field diaphragm (5a) likewise about corresponds to the position of the pole shoe gap of the condenser-objective single field lens.

A multi-stage system of magnetic lenses (7, 8), which serve for magnified imaging of a specimen onto a detector (10), follows the condenser-objective single field lens (5). Only two lenses (7, 8) of the imaging system are shown in FIG. 1; as a rule, this imaging system consists of three or four magnetic lenses.

The control and supply units required for the supply of the individual electron-optical components are denoted in FIG. 1 by (11–16). Voltage and current sources are concerned in this connection, and are controlled by a computer (not shown).

A condenser aperture diaphragm (4a) can selectively be inserted at the level of the pole shoe gap of the objective-side condenser lens (4). This condenser aperture diaphragm (4a) is only required in EDX operation. The front field diaphragm should be removed from the beam path in EDX operation, since otherwise the interfering radiation liberated by the front field diaphragm would mask the measurement signal proper. In this case, the condenser aperture diaphragm (4a) serves to restrict the illuminating aperture.

The condenser-objective single field lens (5) usually has a fixed, predetermined excitation, independent of the enlargement set for the imaging, so that image errors are minimum. Consequently, the current supply (14) for the condenser-objective single field lens (5) always delivers the same fixed excitation current, both in TEM mode and also in STEM mode. The excitation of the condenser-objective single field lens can be altered a little, solely in order to obtain an optimum small electron probe in the plane of the specimen in STEM mode.

In TEM operation, the change of the imaging scale of the specimen on the detector (10) takes place by changing the excitation of the imaging stages (7, 8) following the condenser-objective single field lens (5). For matching the field illuminated on the specimen to the field imaged by the imaging stages (7, 8), the excitation of the first condenser lens (3) which follows the source (1) in the beam path is variable. The excitation of the second condenser lens (4) adjacent to the objective (3) remains fixed, however, in TEM operation and is only varied in STEM operation.

The respective beam paths respectively realized in the plane of the specimen (6) for illuminating illumination fields of different sizes in the plane of the a specimen (6) are shown in FIG. 2. For setting the maximum illumination field, that is, an illumination field with maximum diameter, the source-side condenser lens (3) is strongly excited, so that this condenser lens produces a strongly reduced, real image (C1) of the crossover of the particle source. The imaging scale of this reduced crossover image is about 1:20 to 1:50. The objective-side condenser lens (4) images the reduced image (C1) of the crossover produced by the first condenser lens (3) as a real image in the source-side focal plane of the condenser-objective single field lens, so that a further intermediate image (C1') of the crossover arises. The imaging scale for this second crossover imaging is then about 1:1. Due to the effect of the front field of the condenser-objective single field lens (5), the illumination in the specimen plane (6) takes place by means of axially parallel beams, as is usual in condenser-objective single field lenses.

For the setting of smaller illumination fields, only the excitation of the source-side condenser lens (3) is reduced, while the excitation of the objective-side condenser lens (2), and of course the excitation of the condenser-objective single field lens, remain constant. The crossover image (C2) produced by the source-side condenser lens (3) is then displaced, according to the weakening of the condenser lens (3), in the direction toward the objective-side condenser lens (4), with the consequence that the image (C2') of the crossover image (C2) produced by the objective-side condenser lens (4) is also displaced in the direction toward the condenser-objective single field lens (5). There thence results the illumination us of a smaller illumination field with divergent particle beams in the specimen plane (6).

The minimum illumination field is attained when the excitation of the source-side condenser lens (3) is weakened so much that both condenser lenses (3, 4) in common produce an only slightly reduced image (C3) of the crossover of the particle source, and indeed in the plane conjugate to the specimen plane (6) with respect to the condenser-objective single field lens (5). This plane of the crossover image (C3) is the entry-side image plane of the condenser-objective single field lens (5), so that the condenser-objective single field lens (5) produces a reduced image (C3') of the crossover image (C3) in the specimen plane (6).

As will be apparent from FIG. 2, two crossover images are always produced in TEM operation of the illuminating and imaging system according to the invention, the second crossover image (C1', C2', C3') arises between the source-side focal plane of the condenser-objective single field lens and the specimen plane. The production of the second crossover images in the focal plane of the condenser-objective single field lens and in the specimen plane of the condenser-objective single field lens (5) then respectively represent the limiting settings at maximum or minimum illumination field diameter.

As will further become apparent from FIG. 2, the front field diaphragm (5a) arranged in the source-side focal plane of the condenser-objective single field lens (5) acts to limit the aperture solely at very small illumination field diameters. The opening diameter of the front field diaphragm should be chosen according to the focal length of the condenser-objective single field lens (5) such that the maximum illumination aperture at a minimum illumination field is about 2.5 to 3 mrad. At greater illumination field diameters, the illumination aperture decreases, and is minimum in the extreme case of axially parallel illumination, with a value of below 0.1 mrad. On setting to a minimum illumination field diameter, the two condenser lenses (3, 4) effect in common only a quite weakly reduced imaging of the particle source (1) in the crossover (3). Minimum illumination fields with a diameter of about 1 $\mu$m can nevertheless be attained by the subsequent imaging of this crossover image by means of the condenser-objective single field lens.

In the STEM mode, both condenser lenses are operated as a zoom lens system. The beam path at the smallest possible spot diameter is shown in FIG. 3. In this case, the source-side condenser lens (3) is set to its maximum excitation, which corresponds to the excitation at maximum illuminating field diameter in the TEM mode. The source-side condenser lens consequently produces a crossover image (C4) of the particle source (1), at a 1:30 [?1:3] reduction. The objective-side condenser lens (4) is in this case so strongly excited that it images the crossover image (C4) produced by the source-side condenser lens (3) at an imaging scale of about 1:4 in the entry side image plane, conjugate to the plane of the specimen (6), of the condenser-objective single field lens (5). A further intermediate crossover (C4') consequently arises in this conjugate plane. This further intermediate crossover (C4') is imaged by the condenser-objective single field lens (5) in the plane of the specimen (6), so that a further crossover image (C4") arises there. In this manner, minimum probe sizes of about 7 nm can be produced with unchanged excitation of the condenser-objective single field lens. A minimum spot size of 2.5 nm in diameter can be attained by a slight change of the excitation of the condenser-objective single field lens (5).

If larger spot sizes are to be set which are between the minimum values of about 7 nm or 2.5 nm and 1 $\mu$m, the excitation of the two condenser lenses (3, 4) can be changed so that it forms a zoom system which always images the particle source (1) in the source-side image plane in the source-side image plane of the condenser-objective single field lens (5).

In order to attain a maximum probe current for spot illumination, and thus in STEM mode, in contrast to the TEM mode, a change of the front field diaphragm to a diameter of about 100–200 $\mu$m is required, giving illumination apertures in the range of 5–20 mrad. For a detection of the X-radiation emitted by the specimen (EDX operation), either the front field diaphragm can consist of beryllium, or a condenser diaphragm (4a) can be provided in the vicinity of the main-plane of the objective-side condenser lens (6).

What is claimed is:

1. A particle-optic illuminating and imaging system comprising:
   a particle source,
   a condenser-objective single field lens,
   a condenser lens adjacent to said particle source and a condenser lens adjacent to said condenser-objective single field provided between said particle source and said condenser-objective single field lens, and
   a multi-lens imaging system arranged after said condenser-objective single field lens,
   wherein for variation of an illuminated region in TEM mode, only excitation of said condenser lens adjacent to said particle source is varied and excitation of said condenser lens adjacent to said condenser-objective single field lens is kept constant.

2. The particle-optic illuminating and imaging system according to claim 1, wherein only two condenser lenses are provided.

3. The particle-optic illuminating and imaging system according to claim 1, wherein excitation of said condenser lens adjacent to said condenser-objective single field lens is selected to be constant such that the crossover (C1) produced at maximum excitation of said condenser lens adjacent to the particle source is imaged by said condenser lens adjacent to said condenser-objective single field lens in a source-side focal plane of said condenser-objective single field lens.

4. The particle-optic illuminating and imaging system according to claim 3, wherein at maximum excitation of said condenser lens adjacent to said particle source, said particle source is imaged with an imaging scale smaller than 1:20, by said condenser lens adjacent to said particle source.

5. The particle-optic illuminating and imaging system according to claim 1, wherein the imaging scale of said condenser lens adjacent to said condenser-objective single field lens is greater than 1:3.

6. The particle-optic illuminating and imaging system according to claim 1, wherein a front field diaphragm is provided in a source-side focal plane of said condenser-objective single field lens.

7. The particle-optic illuminating and imaging system according to claim 6, wherein said front field diaphragm is interchangeable.

8. The particle-optic illuminating and imaging system according to claim 1, wherein an aperture diaphragm is provided in the region of a main plane of said condenser lens adjacent to the condenser-objective single field lens.

9. The particle-optic illuminating and imaging system according to claim 1, wherein for production of illuminating fields with a diameter smaller than 0.5 μm and apertures greater than 5 mrad, excitation of said condenser lens adjacent to said particle source and said condenser lens adjacent to said condenser-objective single field lens is varied, such that said particle source is imaged by real or virtual intermediate imaging into a source-side image plane of said condenser-objective single field lens.

10. The particle-optic illuminating and imaging system according to claim 1, wherein in TEM mode, independently of the size of the illuminating field, two intermediate images of said particle source arise at any given time, a second of said two intermediate images (C1', C2', C3') being situated, according to the size of the field to be illuminated, between a source-side focal plane of said condenser-objective single field lens and a specimen plane.

11. A particle-optic illuminating and imaging system comprising:
   a particle source,
   a condenser-objective single field lens,
   a condenser lens adjacent to said particle source and a condenser lens adjacent to said condenser-objective single field provided between said particle source and said condenser-objective single field lens, and a multi-lens imaging system arranged after said condenser-objective single field lens,
   wherein for variation of an illuminated region in TEM mode, only excitation of said condenser lens adjacent to said particle source is varied and excitation of said condenser lens adjacent to said condenser-objective single field lens is kept constant, and
   wherein in TEM mode, independently of the size of the illuminating field, two intermediate images of said particle source arise at any given time, a second of said two intermediate images (C1', C2', C3') being situated, according to the size of the field to be illuminated, between a source-side focal plane of said condenser-objective single field lens and a specimen plane.

12. The particle-optic illuminating and imaging system according to claim 11, wherein only two condenser lenses are provided.

13. The particle-optic illuminating and imaging system according to claim 12, wherein excitation of said condenser lens adjacent to said condenser-objective single field lens is selected to be constant such that the crossover (C1) produced at maximum excitation of said condenser lens adjacent to the particle source is imaged by said condenser lens adjacent to said condenser-objective single field lens in a source-side focal plane of said condenser-objective single field lens.

14. The particle-optic illuminating and imaging system according to claim 11, wherein excitation of said condenser lens adjacent to said condenser-objective single field lens is selected to be constant such that the crossover (C1) produced at maximum excitation of said condenser lens adjacent to the particle source is imaged by said condenser lens adjacent to said condenser-objective single field lens in a source-side focal plane of said condenser-objective single field lens.

15. The particle-optic illuminating and imaging system according to claim 14, wherein at maximum excitation of said condenser lens adjacent to said particle source, said particle source is imaged with an imaging scale smaller than 1.20, by said condenser lens adjacent to said particle source.

16. The particle-optic illuminating and imaging system according to claim 11, wherein the imaging scale of said condenser lens adjacent to said condenser-objective single field lens is greater than 1:3.

17. The particle-optic illuminating and imaging system according to claim 11, wherein a front field diaphragm is provided in a source-side focal plane of said condenser-objective single field lens.

18. The particle-optic illuminating and imaging system according to claim 17, wherein said front field diaphragm is interchangeable.

19. The particle-optic illuminating and imaging system according to claim 11,
   wherein an aperture diaphragm is provided in the region of a main plane of said condenser lens adjacent to the condenser-objective single field lens.

20. The particle-optic illuminating and imaging system according to claim 11, wherein for production of illuminating fields with a diameter smaller than 0.5 μm and apertures greater than 5 mrad, excitation of said condenser lens adjacent to said particle source and said condenser lens adjacent to said condenser-objective single field lens is varied, such that said particle source is imaged by real or virtual intermediate imaging into a source-side image plane of said condenser-objective single field lens.

* * * * *